United States Patent
Tuncer

(10) Patent No.: US 12,519,069 B2
(45) Date of Patent: Jan. 6, 2026

(54) SEMICONDUCTOR PACKAGE WITH BLAST SHIELDING

(71) Applicant: TEXAS INSTRUMENTS INCORPORATED, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/610,050

(22) Filed: Mar. 19, 2024

(65) Prior Publication Data

US 2024/0266306 A1 Aug. 8, 2024

Related U.S. Application Data

(63) Continuation of application No. 17/138,903, filed on Dec. 31, 2020, now Pat. No. 11,935,844.

(51) Int. Cl.
*H01L 23/495* (2006.01)
*H01L 21/56* (2006.01)
(Continued)

(52) U.S. Cl.
CPC .............. *H01L 23/62* (2013.01); *H01L 21/56* (2013.01); *H01L 23/24* (2013.01);
(Continued)

(58) Field of Classification Search
CPC .... H05K 1/11; H05K 1/14; H05K 1/141–147; H05K 1/18;
(Continued)

(56) References Cited

U.S. PATENT DOCUMENTS

| | | | | |
|---|---|---|---|---|
| 5,097,247 | A | * | 3/1992 | Doerrwaechter .... H05K 1/0293 337/403 |
| 5,146,307 | A | | 9/1992 | Kaya |

(Continued)

FOREIGN PATENT DOCUMENTS

WO 2010134922 A1 11/2010

OTHER PUBLICATIONS

Basics of eFuses, Texas Instruments Incorporated, Dallas, Texas, Apr. 2018.

(Continued)

*Primary Examiner* — Tuan T Dinh
(74) *Attorney, Agent, or Firm* — Dawn Jos; Frank D. Cimino

(57) ABSTRACT

A semiconductor package includes a metallic pad and leads, a semiconductor die including a semiconductor substrate attached to the metallic pad, and a conductor including a sacrificial fuse element above the semiconductor substrate, the sacrificial fuse element being electrically coupled between one of the leads and at least one terminal of the semiconductor die, a shock-absorbing material over a profile of the sacrificial fuse element, and mold compound covering the semiconductor die, the conductor, and the shock-absorbing material, and partially covering the metallic pad and leads, with the metallic pad and the leads exposed on an outer surface of the semiconductor package. Either a glass transition temperature of the shock-absorbing material or a melting point of the shock-absorbing material is lower than a melting point of the conductor.

19 Claims, 13 Drawing Sheets

(51) Int. Cl.
*H01L 23/00* (2006.01)
*H01L 23/24* (2006.01)
*H01L 23/31* (2006.01)
*H01L 23/62* (2006.01)
*H02H 7/00* (2006.01)
*H01L 23/29* (2006.01)
*H01L 23/532* (2006.01)

(52) U.S. Cl.
CPC .......... *H01L 23/3135* (2013.01); *H01L 24/32* (2013.01); *H01L 24/48* (2013.01); *H01L 24/73* (2013.01); *H02H 7/008* (2013.01); *H01L 23/293* (2013.01); *H01L 23/296* (2013.01); *H01L 23/49513* (2013.01); *H01L 23/53295* (2013.01); *H01L 2224/32245* (2013.01); *H01L 2224/48245* (2013.01); *H01L 2224/73265* (2013.01)

(58) Field of Classification Search
CPC ............ H05K 1/181–187; H01L 23/24; H01L 23/293; H01L 23/296; H01L 23/62; H01L 23/3135; H01L 23/498; H01L 23/49513; H01L 23/53296
USPC ........ 361/764–767, 782–784, 790, 795, 813, 361/816, 818; 257/665–686, 777–790; 174/520
See application file for complete search history.

(56) References Cited

U.S. PATENT DOCUMENTS

| | | | |
|---|---|---|---|
| 5,682,057 A | 10/1997 | Kuriyama | |
| 6,117,745 A | 9/2000 | Krishnan | |
| 6,469,884 B1 | 10/2002 | Carpenter, Jr. et al. | |
| 6,683,448 B1 | 1/2004 | Ohtsuka | |
| 7,015,587 B1 | 3/2006 | Poddar | |
| 7,088,009 B2 * | 8/2006 | Hagen | H01L 23/552 257/E23.105 |
| 7,551,413 B2 | 6/2009 | Biagi | |
| 7,595,615 B2 | 9/2009 | Li et al. | |
| 8,050,129 B2 | 11/2011 | Liu et al. | |
| 8,564,089 B2 | 10/2013 | Kurz et al. | |
| 8,581,686 B2 | 11/2013 | Galla et al. | |
| 9,059,171 B2 | 6/2015 | Yang et al. | |
| 9,129,769 B2 * | 9/2015 | Wang | H01H 85/0241 |
| 9,240,372 B1 * | 1/2016 | Liou | H01L 23/60 |
| 9,455,222 B1 | 9/2016 | Kawahara et al. | |
| 9,865,537 B1 | 1/2018 | Male et al. | |
| 9,929,110 B1 | 3/2018 | Male et al. | |
| 10,008,356 B2 * | 6/2018 | Yoneda | H01H 37/761 |
| 10,566,276 B2 * | 2/2020 | Gandhi | H01L 23/5328 |
| 11,024,559 B2 * | 6/2021 | Heppner | H01L 25/0655 |
| 2004/0056322 A1 | 3/2004 | Friese et al. | |
| 2005/0040501 A1 * | 2/2005 | Hagen | H01L 24/49 257/784 |
| 2006/0185892 A1 | 8/2006 | Guengerich et al. | |
| 2006/0261364 A1 | 11/2006 | Suehiro et al. | |
| 2007/0206365 A1 | 9/2007 | Shin et al. | |
| 2011/0089494 A1 | 4/2011 | Egawa et al. | |
| 2013/0194752 A1 | 8/2013 | Marbella et al. | |
| 2015/0249043 A1 | 9/2015 | Elian et al. | |
| 2015/0380353 A1 | 12/2015 | Bauer et al. | |
| 2016/0081234 A1 | 3/2016 | Chiu et al. | |
| 2017/0033055 A1 | 2/2017 | Watanabe | |
| 2017/0263568 A1 | 9/2017 | Joen et al. | |
| 2017/0290155 A1 | 10/2017 | Elsherbini et al. | |
| 2017/0330841 A1 | 11/2017 | Cook et al. | |
| 2018/0233422 A1 * | 8/2018 | Gurrum | H01L 23/295 |
| 2019/0393166 A1 | 12/2019 | Otsubo | |
| 2020/0091701 A1 | 3/2020 | Kambham et al. | |
| 2020/0211802 A1 * | 7/2020 | Fujii | H01L 23/28 |
| 2020/0365476 A1 * | 11/2020 | Otsubo | H05K 9/00 |

OTHER PUBLICATIONS

Simplifying EFT, Surge and Power-Fail Protection Circuits in PLC Systems, Texas Instruments Incorporated, Dallas, Texas, Dec. 2018.
TPS2660x 60-V, 2-A Industrial eFuse With Integrated Reverse Input Polarity Protection, Texas Instruments Incorporated, Dallas, Texas, Dec. 2019.

* cited by examiner

SEMICONDUCTOR PACKAGE WITH BLAST SHIELDING

This application is a continuation of patent application Ser. No. 17/138,903, filed Dec. 31, 2020, the contents of all of which are herein incorporated by reference in its entirety.

TECHNICAL FIELD

This disclosure relates to semiconductor devices.

BACKGROUND

Fuses are protective elements in electrical circuits that operate by creating an open circuit under certain conditions. The purpose of a fuse varies according to the application. In some cases, fuses are used as programmable elements to reconfigure logic or memory circuits. More traditionally, a fuse creates a failsafe circuit element to protect an electrical system from overcurrent conditions that can damage wiring or other components within the system. The fuse is either reversibly or irreversibly physically changed to open a circuit during the overcurrent conditions. The open circuit stops current flow before permanent damage occurs elsewhere in the system.

Conventional sacrificial fuse elements are composed of a metal filament that melts and creates an open circuit after a pre-determined amount of current flows through it. A fusible link has metal or conductive components connected by a sacrificial portion that melts, such as solder or a small diameter wire. The open circuit is created when current passes through the fuse element, causing the fuse element to heat enough that the fuse element melts or "blows."

Electronic package technology continues trends towards miniaturization, integration, and speed. Semiconductor packages provide support for a semiconductor die, such as an integrated circuit (IC) and associated bond wires, provide protection from the environment, and enable surface-mounting of the die to and interconnection with an external component, such as a printed circuit board (PCB). Leadframe semiconductor packages are well known and widely used in the electronics industry to house, mount, and interconnect a variety of ICs.

eFuses represent one example of ICs. An eFuse is an active circuit protection device configured to protect electrical components against hazardous current or voltage such as short circuit, inrush, overvoltage, or reverse polarity events. Following detection of a fault condition, an eFuse may trip input load current with a reusable switch.

BRIEF SUMMARY

During an overcurrent event of a sacrificial fuse element within a package, significant energy is released. Heat may cause package material to rupture and fragment, potentially damaging adjacent components of a device, such as the PCB the package is mounted on. As disclosed herein, a semiconductor package with a sacrificial fuse element is able to interrupt high currents while mitigating damage beyond the package during a fusing event.

In one example, a semiconductor package includes a metallic pad and leads, a semiconductor die including a semiconductor substrate attached to the metallic pad, and a conductor including a sacrificial fuse element above the semiconductor substrate, the sacrificial fuse element being electrically coupled between one of the leads and at least one terminal of the semiconductor die, a shock-absorbing material over a profile of the sacrificial fuse element, and mold compound covering the semiconductor die, the conductor, and the shock-absorbing material, and partially covering the metallic pad and leads, with the metallic pad and the leads exposed on an outer surface of the semiconductor package. Either a glass transition temperature of the shock-absorbing material or a melting point of the shock-absorbing material is lower than a melting point of the conductor.

In another example, a semiconductor package includes a metallic pad and leads, a semiconductor die including a semiconductor substrate attached to the metallic pad, and a conductor including a sacrificial fuse element above the semiconductor substrate, the sacrificial fuse element being electrically coupled between one of the leads and at least one terminal of the semiconductor die, a ceramic plate over a profile of the sacrificial fuse element and separated from the sacrificial fuse element by a gap containing the mold compound, and mold compound covering the semiconductor die, the conductor, and the shock-absorbing material, and partially covering the metallic pad and leads, with the metallic pad and the leads exposed on an outer surface of the semiconductor package.

In a further example, a method of forming a package includes attaching a semiconductor die including a semiconductor substrate to a metallic pad of a leadframe. The semiconductor die includes a conductor including a sacrificial fuse element above the semiconductor substrate. The method further includes electrically coupling the sacrificial fuse element to one or more leads of the leadframe, securing a shock-absorbing material over a profile of the sacrificial fuse element, and covering the semiconductor die, the conductor, and the shock-absorbing material, and partially covering the metallic pad and lead with a mold compound, with the metallic pad and the leads remaining exposed on an outer surface of the semiconductor package. Either a glass transition temperature of the shock-absorbing material or a melting point of the shock-absorbing material is lower than a melting point of the conductor.

DETAILED DESCRIPTION

Figure 1A:
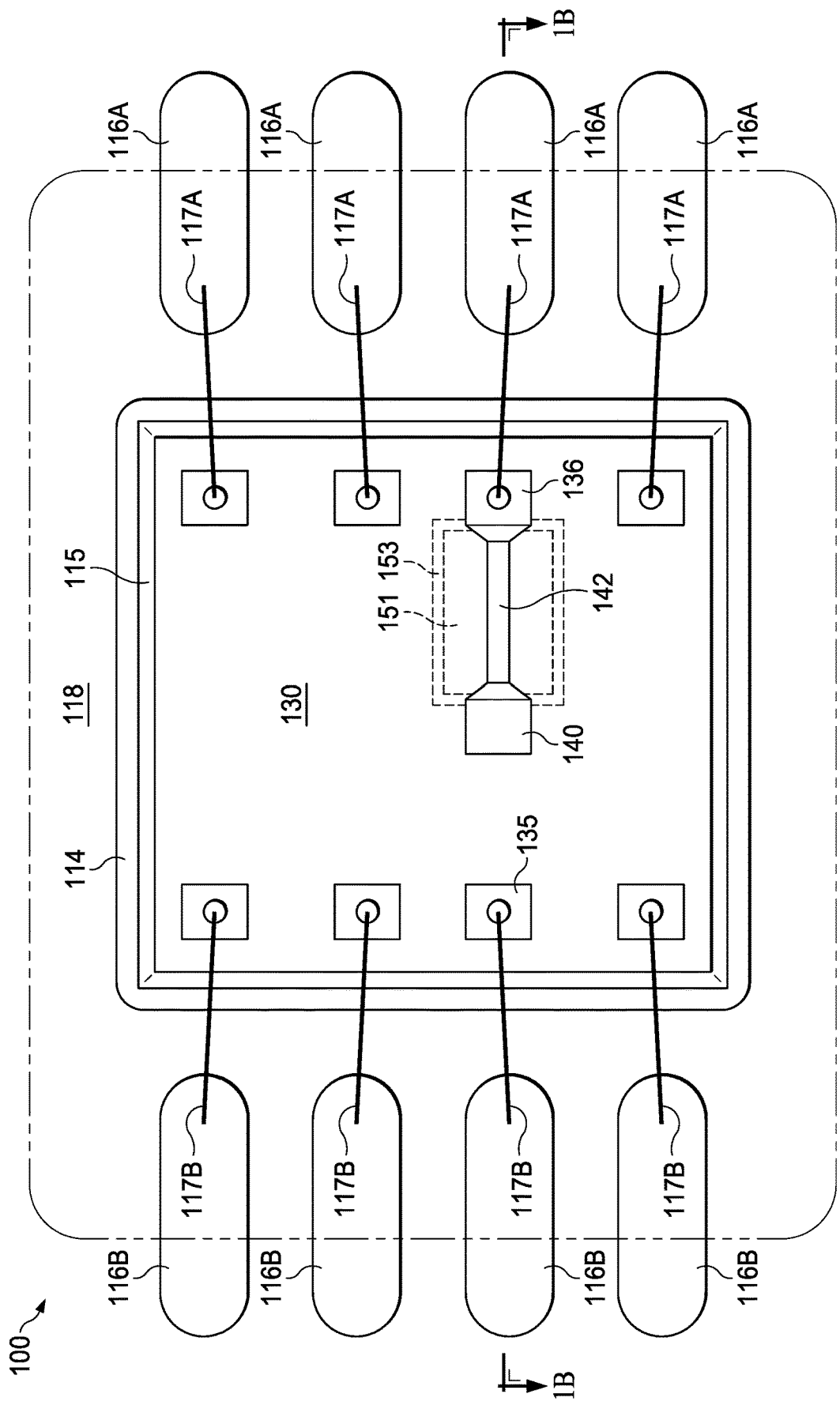
FIGS. 1A and 1B illustrate a top view and a cross-sectional view, respectively, of a semiconductor package including a semiconductor die with a sacrificial fuse element developed above a semiconductor substrate, and a multilayer dielectric between the sacrificial fuse element and the semiconductor substrate, the multilayer dielectric forming planar gaps configured to mitigate damage outside the package from a fusing event.
Figure 1B:
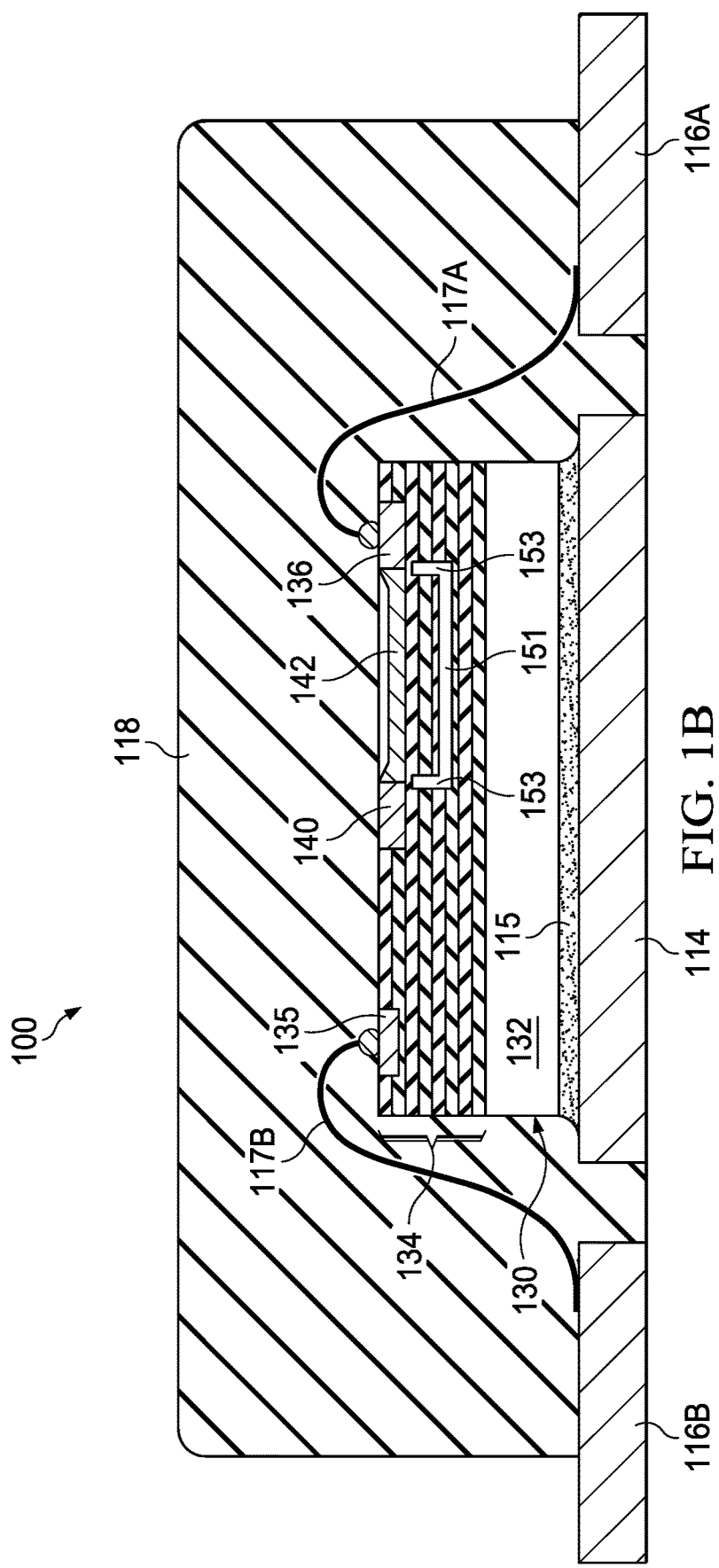

FIGS. 1A and 1B illustrate semiconductor package 100. Specifically, FIG. 1A illustrates a top view of semiconductor package 100, and FIG. 1B illustrates a cross-sectional view of semiconductor package 100. Semiconductor package 100 includes a metallic pad 114 and leads 116A, 116B (collectively, "leads 116"), and a semiconductor die 130 mounted to metallic pad 114 with die attach 115. Wire bonds 117A, 117B (collectively, "wire bonds 117") provide electrical connections between leads 116 and bond pads on the active surface of semiconductor die 130.

Semiconductor package 100 further includes mold compound 118 covering semiconductor die 130 and conductive trace 140, and partially covering metallic pad 114 and leads 116. Metallic pad 114 and leads 116 are exposed on an outer surface of the semiconductor package 100. In this manner, leads 116 provide electrical contact terminals for semiconductor package 100, while metallic pad 114 functions as a heatsink for semiconductor die 130.

Semiconductor die 130 includes two layers: semiconductor substrate 132, which is attached to metallic pad 114, and multilayer dielectric 134, which is over semiconductor substrate 132 on the active surface of semiconductor die 130. Semiconductor substrate 132 is formed from a semiconductor such as polysilicon or silicon/germanium. The inactive surface of semiconductor die 130, the bottom of semiconductor substrate 132, is bonded to metallic pad 114. Multilayer dielectric 134 is formed as a series of build-up layers on top of semiconductor substrate 132 and includes metallization layers providing the functional circuitry (not show) of semiconductor die 130.

Bond pads 135, 136 are exposed in bond pad openings in multilayer dielectric 134 on the active surface of semiconductor die 130. Bond pads 135, 136, provide electrical contact surfaces for wire bonds 117A, 117B. The bond pads are bonded to metallization layers on top of semiconductor substrate 132, and within multilayer dielectric 134.

Multilayer dielectric 134 and the metallization layers of semiconductor die 130 are formed on a semiconductor wafer prior to singulation of semiconductor die 130. For example, metallization layers may represent metal plating layers etched with photolithography, followed by coating with a dielectric layer to fill spaces between the conductive traces of the metal plating layers. The metallization layers include circuit elements such as transistors, diodes, capacitors, and resistors, as well as signal lines and other electrical conductors that interconnect the various circuit elements. As non-limiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

In some specific examples, the functional circuitry of semiconductor die 130 may include an eFuse. An eFuse is an active circuit protection device configured to protect electrical components against hazardous current or voltage such as short circuit, inrush, overvoltage, or reverse polarity events. Following detection of a fault condition, an eFuse may trip input load current with a reusable switch.

However, currents exceeding the capacity of the programmable switch of an eFuse may cause a short across the eFuse, reducing or eliminating the protective effects of the eFuse. Sacrificial fuse element 142, which is connected in series with the eFuse of semiconductor die 130, is configured to interrupt current exceeding the capacity of a reusable switch of the eFuse, permanently isolating the protected electrical components from an input conductor. Including both an eFuse and a sacrificial fuse element 142 within package 100 provides further integration compared to a device including an eFuse and a separate sacrificial fuse and ensures right-sizing sacrificial fuse element 142 to prevent damage to device components outside package 100 during an overcurrent event exceeding the capacity of the eFuse.

eFuses may offer a number of advantages compared to conventional fuses. eFuses may combine the functionality of a number of discrete circuit-protection components, reducing both board space and power consumption compared to alternative circuit-protection solutions. For example, a protection circuit including discrete components might incorporate inrush current control using P-MOSFET, a series diode to block the reverse current as well as reverse polarity, a fuse for overload or short-circuit protection, and comparator logic to disconnect the power path during undervoltage or overvoltage events. eFises are also generally faster and more precise at detecting fault conditions than alternative circuit-protection solutions, including sacrificial fuses.

With the increasing use of integrated circuits, miniaturization of fuses plays a part in the effort to reduce product sizes and costs while still protecting circuits. Higher current fuses result in higher temperatures and additional opportunity for the regrowth of a secondary conductive path. A fuse on an integrated circuit has upper limits on the current capacity as a result of the small geometries and the cost resulting from the multiple levels of masks needed to form the fuses. To attain higher current fuses, the fuse elements are sometimes moved to the PCB where the semiconductor die is mounted or placed off the semiconductor die but still located inside the package. The disadvantage of creating a fuse from an element of the PCB is that when blown, the entire PCB can require replacing, a cost prohibitive repair. A more practical solution is to form a sacrificial fuse element within a package so that in case of a blown fuse, only the packaged part needs to be replaced. In an application using a semiconductor power device, a common overstress failure mode is a shorted device (e.g., a current path to ground). MOSFET devices forming power switches sometimes fail in a shorted state with a path to ground due to an overvoltage, an ESD strike, exceeding safe operating conditions for the device or from a defect in the manufacture of the device. These failure modes require a fuse element to protect the system.

One or more metallization layers within multilayer dielectric 134 form conductive trace 140. Specifically traces of adjacent metallization layers may be stacked on top of each other to form conductive trace 140. Sacrificial fuse element 142 is a portion of conductive trace 140 with a narrowed cross section. The narrowed cross section may be provided by thinner width metallization layer(s) and/or fewer metallization layer(s) compared to other portions of conductive trace 140.

Conductive trace 140 is part of a load current path through semiconductor package 100. For example, the load current path through the semiconductor package 100 may include, in series, a first lead 116, wire bond 117A spanning the first lead 116 and bond pad 136 of conductive trace 140, functional circuitry of semiconductor die 130, the functional circuitry incorporating an eFuse in some examples, bond pad 135, wire bond 117B spanning semiconductor die 130 and a second lead 116, and the second lead 116. Functional circuitry of semiconductor die 130 and internal connections to conductive trace 140 are not illustrated in FIGS. 1A and 1B.

Conductive trace 140 is electrically coupled between one of the leads 116 and at least one terminal, such as bond pads 135, 136, of semiconductor die 130. Specifically, conductive trace 140 is electrically coupled in series between bond pads 135, 136. In the illustrated example, conductive trace 140 is directly coupled to bond pad 136 in that bond pad 136 and conductive trace 140 are formed from contiguous metallization layer(s) within multilayer dielectric 134. In some examples, conductive trace 140 may carry load current which is distributed over more than one pair of wire bonds 117A, 117B. By distributing load current among multiple bond wires 117, package 100 facilitates a current carrying capacity in excess of the current carrying capacity of a single bond wire 117.

Sacrificial fuse element 142 of conductive trace 140 is configured to form an open circuit in an overcurrent condition. During an overcurrent event, the overcurrent passes through sacrificial fuse element 142, causing sacrificial fuse element 142 to heat enough that a portion the narrowed cross-section of conductive trace 140 melts or "blows." During the melting phase, as the current begins to be interrupted and the open forms, an arc can form which vaporizes a portion of the fuse material. The arc will grow, consuming and vaporizing the sacrificial fuse element, until the distance becomes too long to sustain the arc and current stops flowing.

During a fusing event, significant energy is released. Heat and gasses from vaporization and burning may cause package material to rupture and fragment, potentially damaging adjacent components of a device, such as the PCB the package is mounted on. Semiconductor package 100 with a sacrificial fuse element 142 is able to interrupt high currents while mitigating damage beyond the package during an overcurrent event. Specifically, package 100 and semiconductor die 130 include structural features to absorb and deflect energy during a fusing event.

In particular, multilayer dielectric 134, which is physically located between sacrificial fuse element 142 and semiconductor substrate 132, is configured to mitigate damage outside package 100 from a fusing event. For example, multilayer dielectric 134 forms a planar gap 151 beneath a profile of sacrificial fuse element 142 in a direction normal to the top view of FIG. 1A. As referred to herein the profile of sacrificial fuse element 142 represents its outer perimeter, projected in a direction parallel to the thickness of semiconductor die 130, on the major surface of semiconductor die 130 adjacent to sacrificial fuse element 142.

The multilayer dielectric 134 further forms a transverse gap 153 that intersects planar gap 151 around a perimeter of planar gap 151. Transverse gap 153 surrounds the profile of sacrificial fuse element 142, substantially isolating a section of the multilayer dielectric 134 underneath sacrificial fuse element 142. In some examples, planar gap 151 may be formed in a single layer of multilayer dielectric 134, and transverse gap 153 may extend across multiple adjacent layers of multilayer dielectric 134 such that transverse gap 153 intersects planar gap 151 about a perimeter of planar gap 151.

In various examples, multilayer dielectric 134 may include a silicate glass, such as silicon dioxide, or silicon oxycarbide. Gaps 151, 153 promote cracking of multilayer dielectric 134 below sacrificial fuse element 142 during a fusing event, thereby directing pressure downward toward metallic pad 114 and facilitating energy absorption of mechanical energy from the fusing event.

In various examples, gaps 151, 153 may be filled with various gasses or materials. In one example, gaps 151, 153 may contain a nitrogen gas, such as pure nitrogen or air. The nitrogen gas may remain in voids forming gaps 151, 153 of as a result of manufacturing of semiconductor die 130 in a clean room environment.

In the same or different examples, semiconductor die 130 may include a malleable material within gaps 151, 153 or a portion thereof. In some examples, the malleable material may be a metal or metal alloy with a melting point lower than a melting point of sacrificial fuse element 142. The malleable material absorbs heat, for example, by melting, and mechanical energy, for example, by plastic deformation, during a fusing event. With a lower melting point than sacrificial fuse element 142, the malleable material may melt prior to or in conjunction with the fusing event.

For example, conductive trace 140, including sacrificial fuse element 142 may be formed from copper or a copper alloy, and the malleable material may include one or more of gold, iron, silver, copper, aluminum, lithium, tin, and indium. In some examples, the malleable material within gaps 151, 153 may contain at least 50 percent by weight aluminum, such as at least 90 percent by weight aluminum, whereas conductive trace 140 may include at least 90 percent by weight copper.

Gaps 151, 153 provide a rectangular profile surrounding the profile of sacrificial fuse element 142. Multilayer dielectric 134 provides one example configuration of gaps, and other configurations may also be suitable to deflect and absorb energy during a fusing event. Two additional examples incorporated within semiconductor die 160 and semiconductor die 170 as illustrated in FIGS. 2A, 2B, 3A and 3B.

Mold compound 118 provides a protective layer covering electronics of semiconductor package 100. Specifically, mold compound 118 covers semiconductor die 130 with conductive trace 140, wire bonds 117, and partially covers metallic pad 114 and leads 116, with metallic pad 114 and the leads 116 exposed on an outer surface of the semiconductor package 100. In this manner, leads 116 provide electrical contact terminals for semiconductor package 100, while metallic pad 114 functions as a heatsink for semiconductor die 130.

Mold compound 118 may be formed from a nonconductive plastic or resin material. Mold compounds suitable for use as mold compound 118 include, for example, thermoset compounds that include an epoxy novolac resin, multi-aromatic resin, multi-functional resins, or similar material combined with a filler, such as alumina, and other materials to make the compound suitable for molding, such as accelerators, curing agents, filters, and mold release agents.

Leadframes, such as leadframe containing metallic pad 114 and leads 116, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to leadframe attachment, such as solder reflowing, wire bonding or metal trace pattering, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe of represents the portions of the leadframe strip remaining within a package after singulation. With respect to semiconductor package 100, its leadframe includes metallic pad 114 and leads 116 although those conductive elements are not directly interconnected following singulation of semiconductor package 100.

Figure 2A:
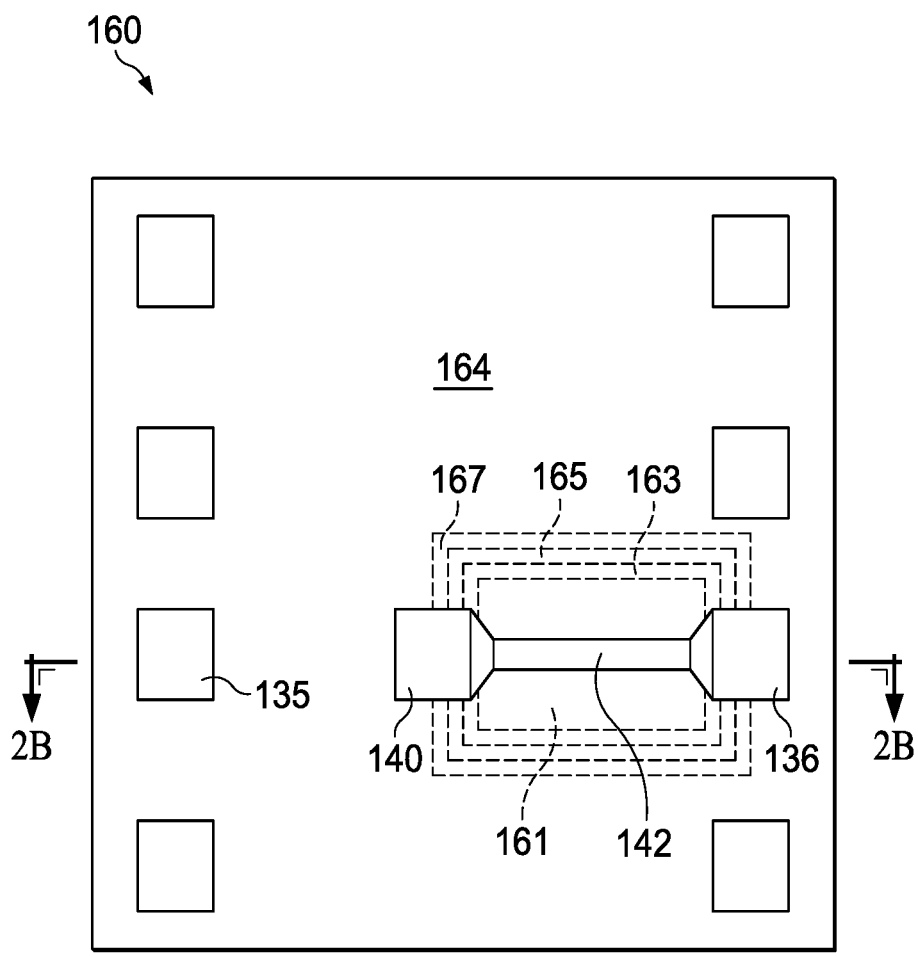
FIGS. 2A and 2B illustrate a top view and a cross-sectional view, respectively, of a semiconductor die with a sacrificial fuse element developed above a semiconductor substrate, and a multilayer dielectric between the sacrificial fuse element and the semiconductor substrate, the multilayer dielectric forming planar gaps configured to mitigate damage outside a package from a fusing event.
Figure 2B:
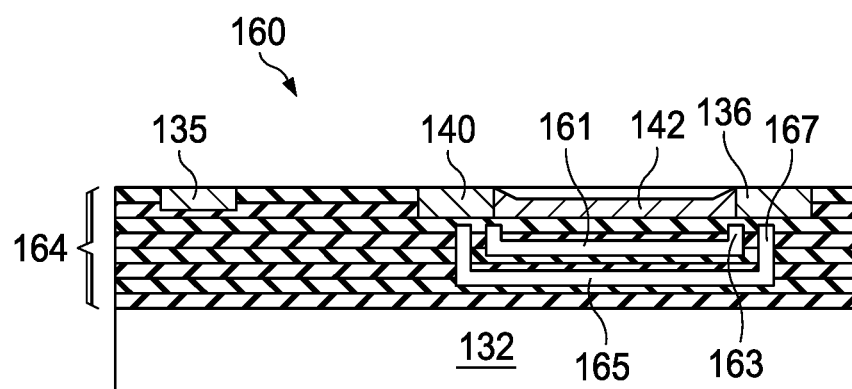

FIGS. 2A and 2B illustrate a top view and a cross-sectional view, respectively, of an alternative semiconductor die 160 to replace semiconductor die 130 within package 100. Semiconductor die 160 is substantially similar to semiconductor die 130 except for the configuration of gaps 161, 163, 165, 167 within multilayer dielectric 164. Elements of semiconductor die 160 with the same numbers as semiconductor die 130 are the same or substantially similar to those elements in semiconductor die 130. For brevity, such elements are described in limited or no detail with respect to semiconductor die 160.

Semiconductor die 160 includes two layers: semiconductor substrate 132, and multilayer dielectric 164, which is over semiconductor substrate 132 on the active surface of semiconductor die 160. Multilayer dielectric 164 is formed as a series of build-up layers on top of semiconductor substrate 132 with metallization layers providing the functional circuitry (not show) of semiconductor die 160. Stacked traces of one or more metallization layers form conductive trace 140, a metal conductor configured to carry a load current. Sacrificial fuse element 142 is a portion of conductive trace 140 with a narrowed cross section.

Multilayer dielectric 164, which is located between sacrificial fuse element 142 and the semiconductor substrate 132, is configured to mitigate damage outside package 100 from a fusing event. Multilayer dielectric 164 is substantially similar to multilayer dielectric 134, the only exception being the different configuration of gaps 161, 163, 165, 167 as compared to gaps 151, 153. For brevity, details of multilayer dielectric 134 are not described again with respect to multilayer dielectric 164.

In contrast to multilayer dielectric 134, multilayer dielectric 164, includes two planar gaps 161, 165 beneath a profile of sacrificial fuse element 142 in a direction normal to the top view of FIG. 2A. The multilayer dielectric 164 further forms a first transverse gap 163 that intersects planar gap 161 around a perimeter of planar gap 161, and second transverse gap 167 that intersects planar gap 165 around a perimeter of planar gap 165. Planar gaps 161, 165 provide rectangular profiles surrounding the profile of sacrificial fuse element 142, which the profile of planar gap 165 also surrounding the profile of planar gap 161. In addition, transverse gaps 163, 167 each surrounds a profile of sacrificial fuse element 142, substantially isolating sections of the multilayer dielectric 164 underneath sacrificial fuse element 142. In this specific, example, transverse gap 167 also surrounds a profile of transverse gap 163.

In some examples, planar gaps 161, 165 may each be formed in a single layer of multilayer dielectric 164, whereas transverse gap 163, 167 may extend across multiple adjacent layers of multilayer dielectric 164.

Gaps 161, 163, 165, 167 promote cracking of multilayer dielectric 164 below sacrificial fuse element 142 during a fusing event, thereby directing pressure downward toward metallic pad 114 and facilitating energy absorption of mechanical energy from the fusing event.

As described with respect to semiconductor die 130, in various examples, gaps 161, 163, 165, 167 may be filled with various gasses or materials, such as nitrogen gas, and/or a malleable material including one or more of gold, iron, silver, copper, aluminum, lithium, tin and indium. In some examples, the malleable material within gaps 151, 153 may contain at least 50 percent by weight aluminum, such as at least 90 percent by weight aluminum, whereas conductive trace 140 may include at least 90 percent by weight copper.

Compared to multilayer dielectric 134, multilayer dielectric 164 may provide further energy absorption by separating multilayer dielectric 164 underneath sacrificial fuse element 142 into multiple layers, and by providing additional space for malleable material within gaps 161, 163, 165, 167, which may absorb heat and mechanical energy during a fusing event.

Figure 3A:
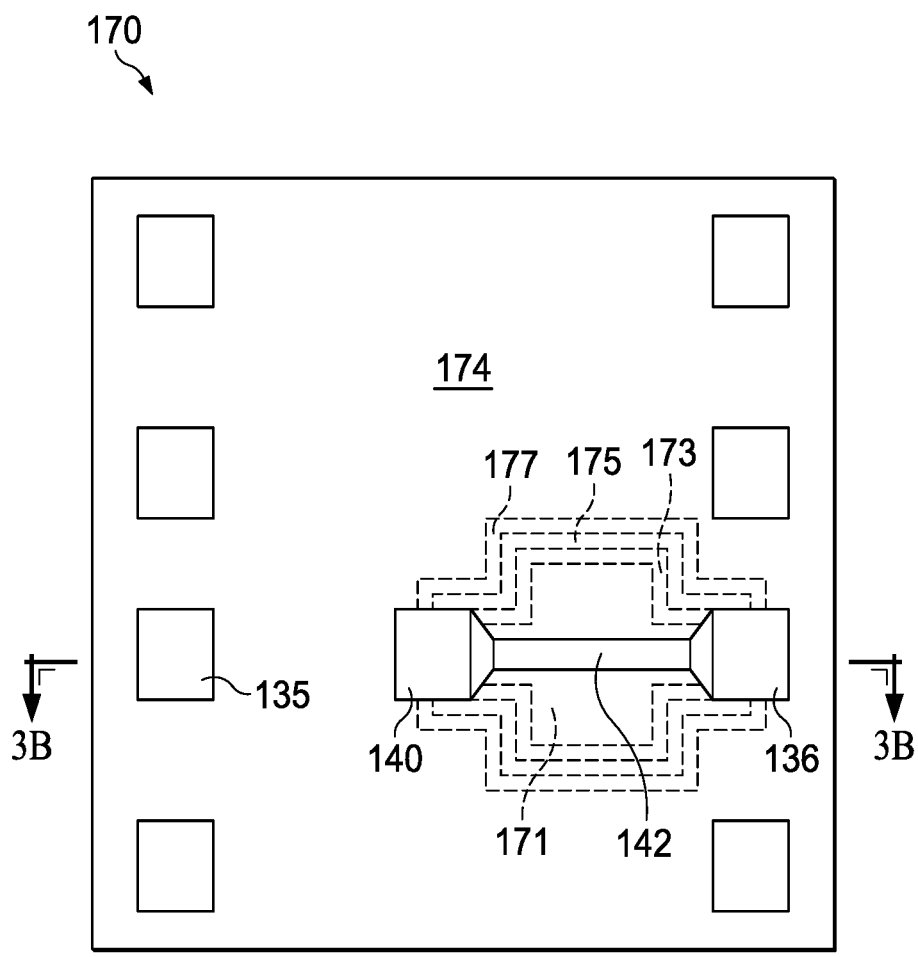
FIGS. 3A and 3B illustrate a top view and a cross-sectional view, respectively, of a semiconductor die with a sacrificial fuse element developed above a semiconductor substrate, and a multilayer dielectric between the sacrificial fuse element and the semiconductor substrate, the multilayer dielectric forming planar gaps configured to mitigate damage outside the package from a fusing event.
Figure 3B:
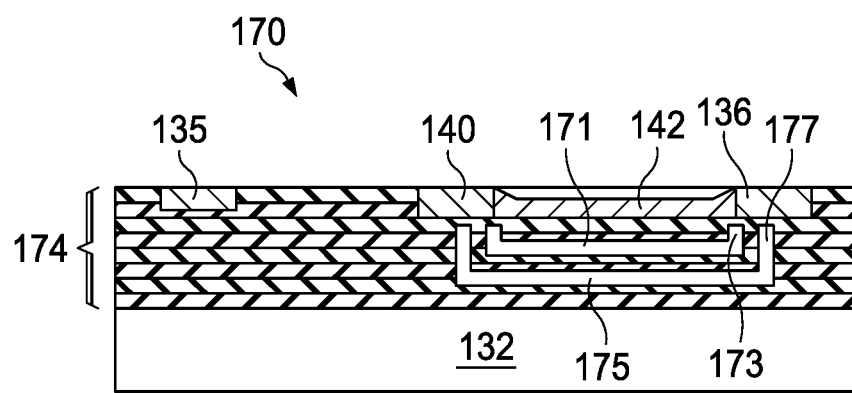

FIGS. 3A and 3B illustrate a top view and a cross-sectional view, respectively, of an alternative semiconductor die 170 to replace semiconductor die 130 within package 100. Semiconductor die 170 is substantially similar to semiconductor die 130 except for the configuration of gaps 171, 173, 175, 177 within multilayer dielectric 174. Elements of semiconductor die 170 with the same numbers as semiconductor die 130 are the same or substantially similar to those elements in semiconductor die 130. For brevity, such elements are described in limited or no detail with respect to semiconductor die 170.

Semiconductor die 170 includes two layers: semiconductor substrate 132, and multilayer dielectric 174, which is over semiconductor substrate 132 on the active surface of semiconductor die 170. Multilayer dielectric 174 is formed as a series of build-up layers on top of semiconductor substrate 132 with metallization layers providing the functional circuitry (not show) of semiconductor die 170. Stacked traces of one or more metallization layers form conductive trace 140. Sacrificial fuse element 142 is a portion of conductive trace 140 with a narrowed cross section.

Multilayer dielectric 174, which is located between sacrificial fuse element 142 and the semiconductor substrate 132, is configured to mitigate damage outside package 100 from a fusing event. Multilayer dielectric 174 is substantially similar to multilayer dielectric 134, the only exception being the different configuration of gaps 171, 173, 175, 177 as compared to gaps 151, 153. For brevity, details of multilayer dielectric 134 are not described again with respect to multilayer dielectric 174.

In contrast to multilayer dielectric 134, multilayer dielectric 174, includes two planar gaps 171, 175 beneath a profile of sacrificial fuse element 142 in a direction normal to the top view of FIG. 3A. The multilayer dielectric 174 further forms a first transverse gap 173 that intersects planar gap 171 around a perimeter of planar gap 171, and second transverse gap 177 that intersects planar gap 175 around a perimeter of planar gap 175. Planar gaps 171, 175 provide cross-shaped profiles surrounding the profile of sacrificial fuse element 142, which the profile of planar gap 175 surrounding the profile of planar gap 171. Transverse gaps 173, 177 each surrounds a profile of sacrificial fuse element 142, substantially isolating sections of the multilayer dielectric 174 underneath sacrificial fuse element 142. In this specific, example, transverse gap 177 also surrounds a profile of transverse gap 173.

In some examples, planar gaps 171, 175 may each be formed in a single layer of multilayer dielectric 174, whereas transverse gap 173, 177 may extend across multiple adjacent layers of multilayer dielectric 174.

Gaps 171, 173, 175, 177 promote cracking of multilayer dielectric 174 below sacrificial fuse element 142 during a fusing event, thereby directing pressure downward toward metallic pad 114 and facilitating energy absorption of mechanical energy from the fusing event.

As described with respect to semiconductor die 130, in various examples, gaps 171, 173, 175, 177 may be filled with various gasses or materials, such as nitrogen gas, and/or a malleable material including one or more of gold, iron, silver, copper, aluminum, lithium, tin and indium. In some examples, the malleable material within gaps 151, 153 may contain at least 50 percent by weight aluminum, such as at least 90 percent by weight aluminum, whereas conductive trace 140 may include at least 90 percent by weight copper.

Compared to multilayer dielectric 134, multilayer dielectric 174 may provide further energy absorption by separating multilayer dielectric 174 underneath sacrificial fuse element 142 into multiple layers, and by providing additional space for malleable material within gaps 171, 173, 175, 177, which may absorb heat and mechanical energy during a fusing event. In addition, the cross-shape of material within gaps 173, 177 may facilitate further deformation of the malleable material without tearing as compared to the rectangular profile of gap 153.

Figure 4A:
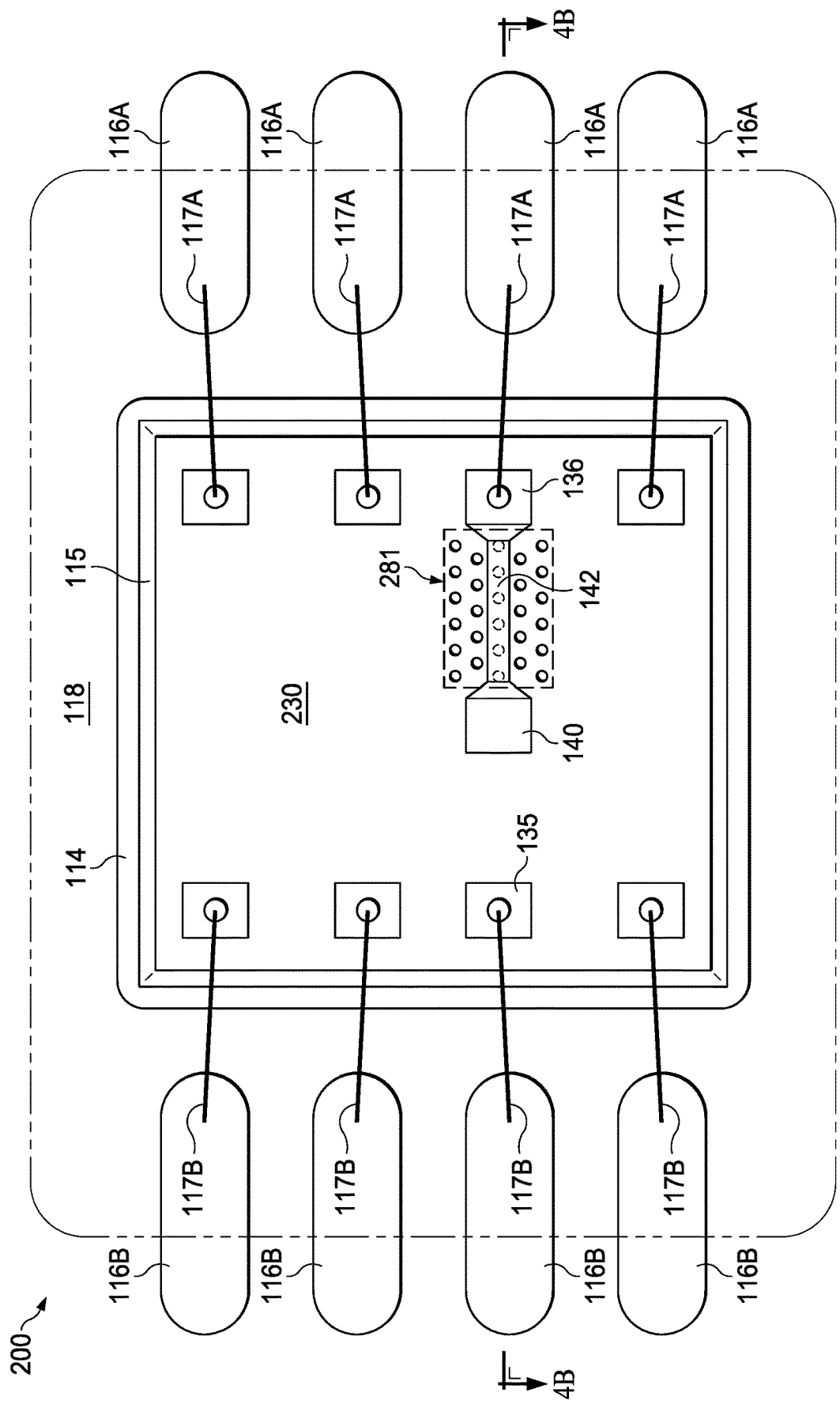
FIGS. 4A and 4B illustrate a top view and a cross-sectional view, respectively, of a semiconductor package including a semiconductor die with a sacrificial fuse element developed above a semiconductor substrate, the semiconductor substrate forming an array of vias adjacent to the sacrificial fuse element.
Figure 4B:
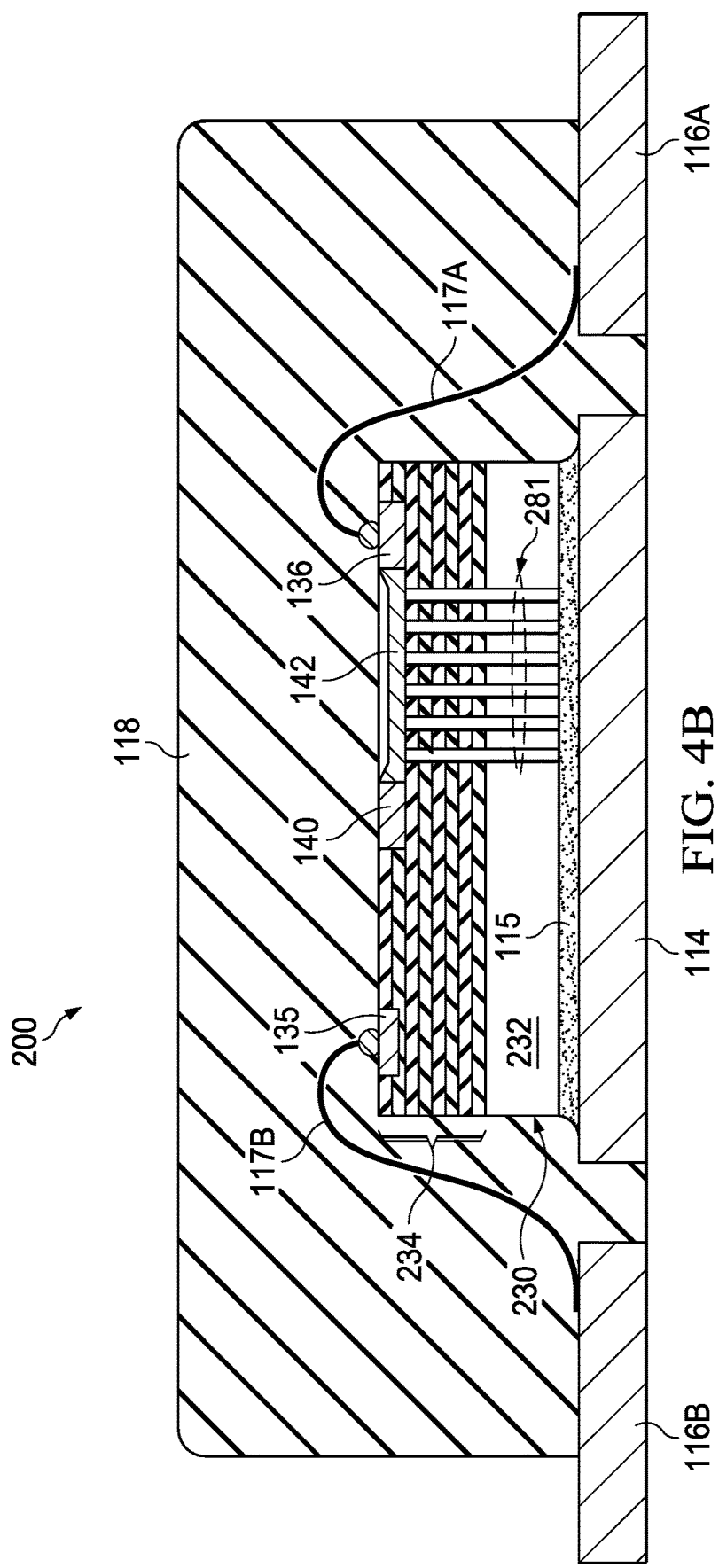

FIGS. 4A and 4B illustrate semiconductor package 200. Specifically, FIG. 4A illustrates a top view of semiconductor package 200, and FIG. 4B illustrates a cross-sectional view of semiconductor package 200. Semiconductor package 200 is substantially similar to semiconductor package 100 except that semiconductor die 230 includes vias 270 adjacent to sacrificial fuse element 142, and not gaps within its multilayer dielectric. Other details of semiconductor package 200 are the same as described with respect to semiconductor package 100. For example, elements of semiconductor package 200 with the same numbers as semiconductor package 100 are the same or substantially similar to those elements in semiconductor package 100. For brevity, such details and elements are described in limited or no detail with respect to semiconductor package 200.

Like semiconductor package 100, semiconductor package 200 includes a metallic pad 114 and leads 116, with a semiconductor die 230 mounted to metallic pad 114 with die attach 115. Wire bonds 117 provide electrical connections between leads 116 and bond pads on the active surface of semiconductor die 230.

Semiconductor die 230 includes two layers: semiconductor substrate 232, which is attached to metallic pad 114, and multilayer dielectric 234, which is over semiconductor substrate 232 on the active surface of semiconductor die 230. The inactive surface of semiconductor die 230, the bottom of semiconductor substrate 232, is bonded to metallic pad 114. Multilayer dielectric 234 is formed as a series of build-up layers on top of semiconductor substrate 232 and includes metallization layers providing the functional circuitry (not show) of semiconductor die 230 as described with respect to semiconductor die 130.

As also described with respect to semiconductor die 130, the metallization layers within multilayer dielectric 234 form conductive trace 140 including sacrificial fuse element 142. Package 200 and semiconductor die 230 include structural features to absorb and deflect energy during a fusing event. In particular, semiconductor substrate 132, which is physically located between sacrificial fuse element 142 and the semiconductor substrate 232, is configured to mitigate damage outside package 200 from a fusing event. For example, semiconductor substrate 132 forms an array of vias 281 adjacent to sacrificial fuse element 142. In the illustrated example, the vias 281 also extend within multilayer dielectric 234.

Vias 281 extend from a first side of semiconductor die 130 adjacent to sacrificial fuse element 142 through a thickness of the semiconductor substrate 132 to a second side of the semiconductor die 130 adjacent to the metallic pad 114. Vias 281 extend from a side of the semiconductor die 130 adjacent to metallic pad 114 in a direction about perpendicular to the side of semiconductor die 130 adjacent to the metallic pad 114.

Vias 281 form a patterned array in the semiconductor substrate 132. In some examples, vias 281 cover at least 20 percent of a contiguous area the semiconductor die 130 adjacent to sacrificial fuse element 142.

One or more of vias 281 have a round cross-section. For example, vias 281 may be formed by laser drilling into semiconductor substrate 232 and/or multilayer dielectric 234 either before, during or after the build-up of the metallization layers of multilayer dielectric 234. Such a laser drilling process results in generally circular cross sections for each via 281. However, a laser drill can also create different shapes, e.g., by drilling a via with more than one pass. For example, three adjacent drilling operations could be used to create a via with a generally triangular cross-section, albeit including corners with a radius matching that of the laser drill.

In various examples, multilayer dielectric 234 may include a silicate glass, such as silicon dioxide, or silicon oxycarbide. Vias 281 promote cracking of multilayer dielectric 234 below sacrificial fuse element 142 during a fusing event, thereby directing pressure downward toward metallic pad 114 and facilitating energy absorption of mechanical energy from the fusing event.

In various examples, semiconductor die 230 may include a malleable material within vias 281 or a portion thereof. In some examples, the malleable material may be a metal or metal alloy with a melting point lower than a melting point of sacrificial fuse element 142. The malleable material absorbs heat, for example, by melting, and mechanical energy, for example, by plastic deformation, during a fusing event. With a lower melting point than sacrificial fuse element 142, the malleable material may melt prior to or in conjunction with the fusing event.

For example, conductive trace 140, including sacrificial fuse element 142 may be formed from copper or a copper alloy, and the malleable material may include one or more of gold, iron, silver, copper, aluminum, lithium, tin, and indium. In some examples, the malleable material within vias 281 may contain at least 50 percent by weight aluminum, such as at least 90 percent by weight aluminum, whereas conductive trace 140 may include at least 90 percent by weight copper.

In the same or different examples, vias 281 may be filled with various gasses or materials. In one example, vias 281 may contain nitrogen gas, such as pure nitrogen or air. The nitrogen gas may remain in vias 281 of as a result of manufacturing of semiconductor die 230 in a clean room environment.

Semiconductor die 230 provides one example configuration of vias, and other configurations may also be suitable to deflect and absorb energy during a fusing event. For example, while vias 281 are depicted as having a round cross section that extends perpendicularly relative to the surface of die 230 adjacent conductive trace 140, in other examples, vias may be noncircular, and/or extend in non-perpendicular directions relative to the surface of die 230 adjacent conductive trace 140. Moreover, vias 281 may extend only partially through semiconductor substrate 232, and/or partially through multilayer dielectric 234.

Figure 5A:
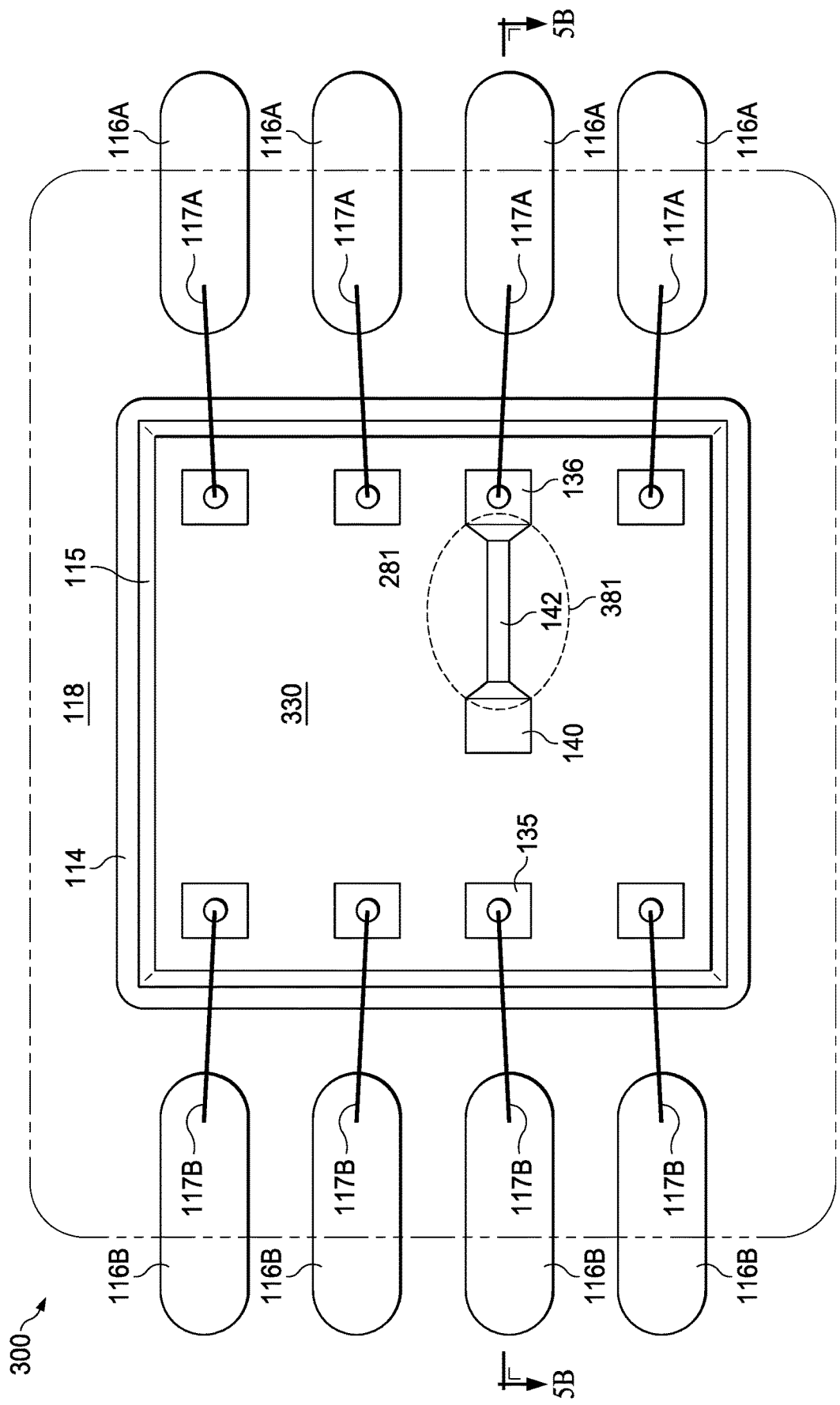
FIGS. 5A and 5B illustrate a top view and a cross-sectional view, respectively, of a semiconductor package including a semiconductor die with a sacrificial fuse element developed above a semiconductor substrate, and a shock-absorbing material covering the sacrificial fuse element on the semiconductor die.
Figure 5B:
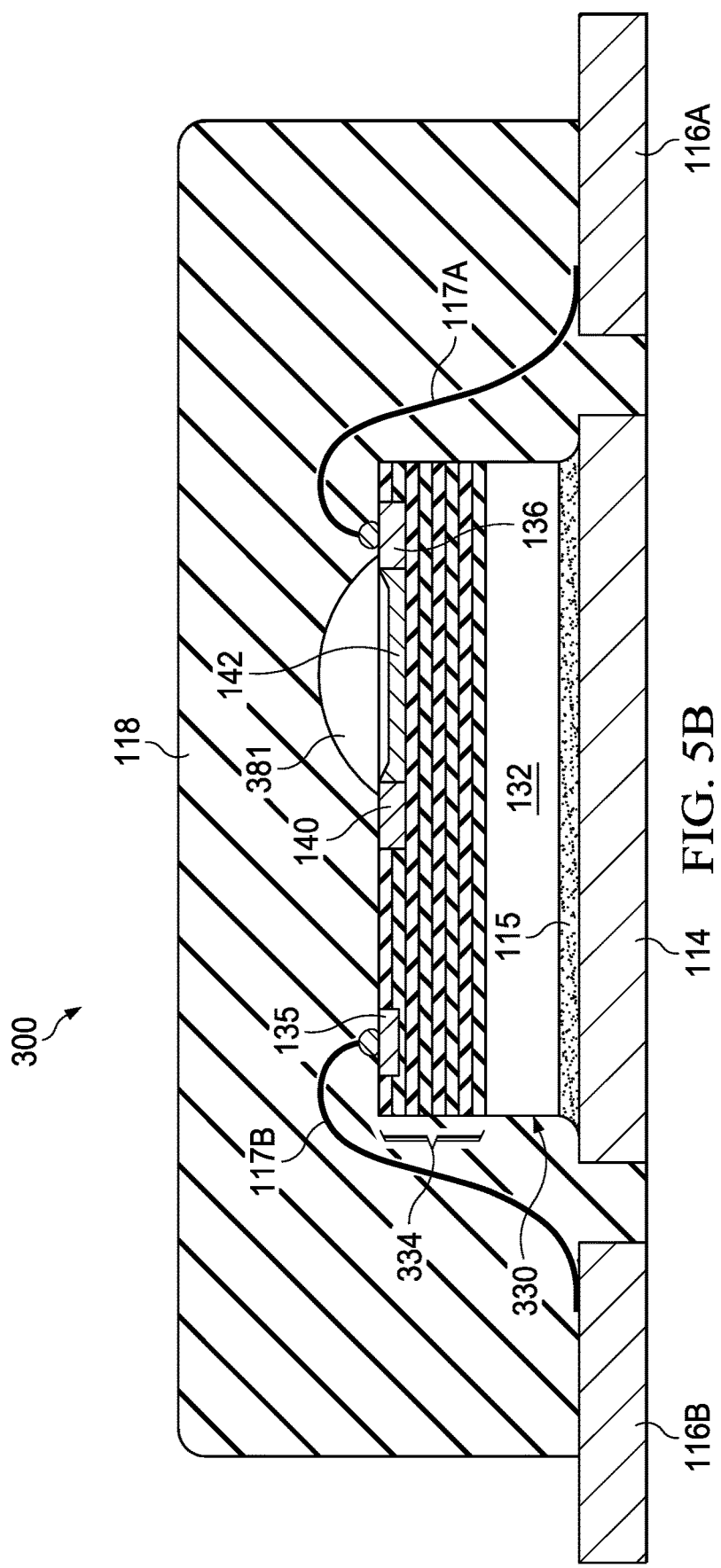

FIGS. 5A and 5B illustrate semiconductor package 300. Specifically, FIG. 5A illustrates a top view of semiconductor package 300, and FIG. 5B illustrates a cross-sectional view of semiconductor package 300. Semiconductor package 300 is substantially similar to semiconductor package 100 except for the addition of a shock-absorbing material 381 over a profile of sacrificial fuse element 142 and semiconductor die 330 does include not gaps within its multilayer dielectric. Other details of semiconductor package 300 are the same as described with respect to semiconductor package 100. For example, elements of semiconductor package 300 with the same numbers as semiconductor package 100 are the same or substantially similar to those elements in semiconductor package 100. For brevity, such details and elements are described in limited or no detail with respect to semiconductor package 300.

As referred to herein, a shock-absorbing material is one that, in response to shock and resulting mechanical stress from a fusing event, elastically or plastically deforms without cracking more readily than the material of the adjacent mold compound. In some examples, a shock-absorbing material may have a higher strength than the adjacent mold compound, effectively redirecting blast energy from a fusing event. In the same or different examples, a glass transition temperature of the shock-absorbing material or a melting point of the shock-absorbing material is lower than a melting point of the fusing conductor. In such examples, the shock-absorbing material is in an elastic or viscous state during a fusing event, and deformation of the shock-absorbing material both absorbs and distributes mechanical energy to the adjacent mold compound, reducing the magnitude of mechanical stress felt by the mold compound, thereby mitigating a risk of fragmenting the mold compound.

Like semiconductor package 100, semiconductor package 300 includes a metallic pad 114 and leads 116, with a semiconductor die 330 mounted to metallic pad 114 with die attach 115. Wire bonds 117 provide electrical connections between leads 116 and bond pads on the active surface of semiconductor die 330.

Semiconductor die 330 includes two layers: semiconductor substrate 132, which is attached to metallic pad 114, and multilayer dielectric 334, which is over semiconductor substrate 132 on the active surface of semiconductor die 330. The inactive surface of semiconductor die 330, the bottom of semiconductor substrate 132, is bonded to metallic pad 114. Multilayer dielectric 334 is formed as a series of build-up layers on top of semiconductor substrate 132 and includes metallization layers providing the functional circuitry (not show) of semiconductor die 330 as described with respect to semiconductor die 130.

As also described with respect to semiconductor die 130, the metallization layers within multilayer dielectric 334 form conductive trace 140 including sacrificial fuse element 142. Package 300 includes structural features to absorb and deflect energy during a fusing event. In particular, shock-absorbing material 381, located over a profile of sacrificial fuse element 142, is configured to mitigate damage outside package 300 from a fusing event. Shock-absorbing material 381 is in direct contact with the semiconductor die 330 adjacent to sacrificial fuse element 142.

A glass transition temperature of the shock-absorbing material 381 is lower than a melting point of conductive trace 140. Thus, shock-absorbing material 381 is in an elastic or viscous state during a fusing event, facilitates deformation of shock-absorbing material 381 during a fusing event, thereby absorbing and distributing mechanical energy to mold compound 118, mitigating a risk of fragmenting mold compound 118 during a fusing event.

In some examples, conductive trace 140, including sacrificial fuse element 142 may be formed from copper or a copper alloy, and the shock-absorbing material 381 may include a dielectric elastomer, such as silicone, polyimide, bismaleimide, polyetherimide, or similar material.

During manufacturing of package 300, shock-absorbing material 381 is applied to semiconductor die 330 prior to a molding process for mold compound 118. For example, shock-absorbing material 381 could be applied prior to singulating semiconductor die 330 from a semiconductor wafer, or after mounting semiconductor die 330 to metallic pad 114 with die attach 115.

Figure 6A:
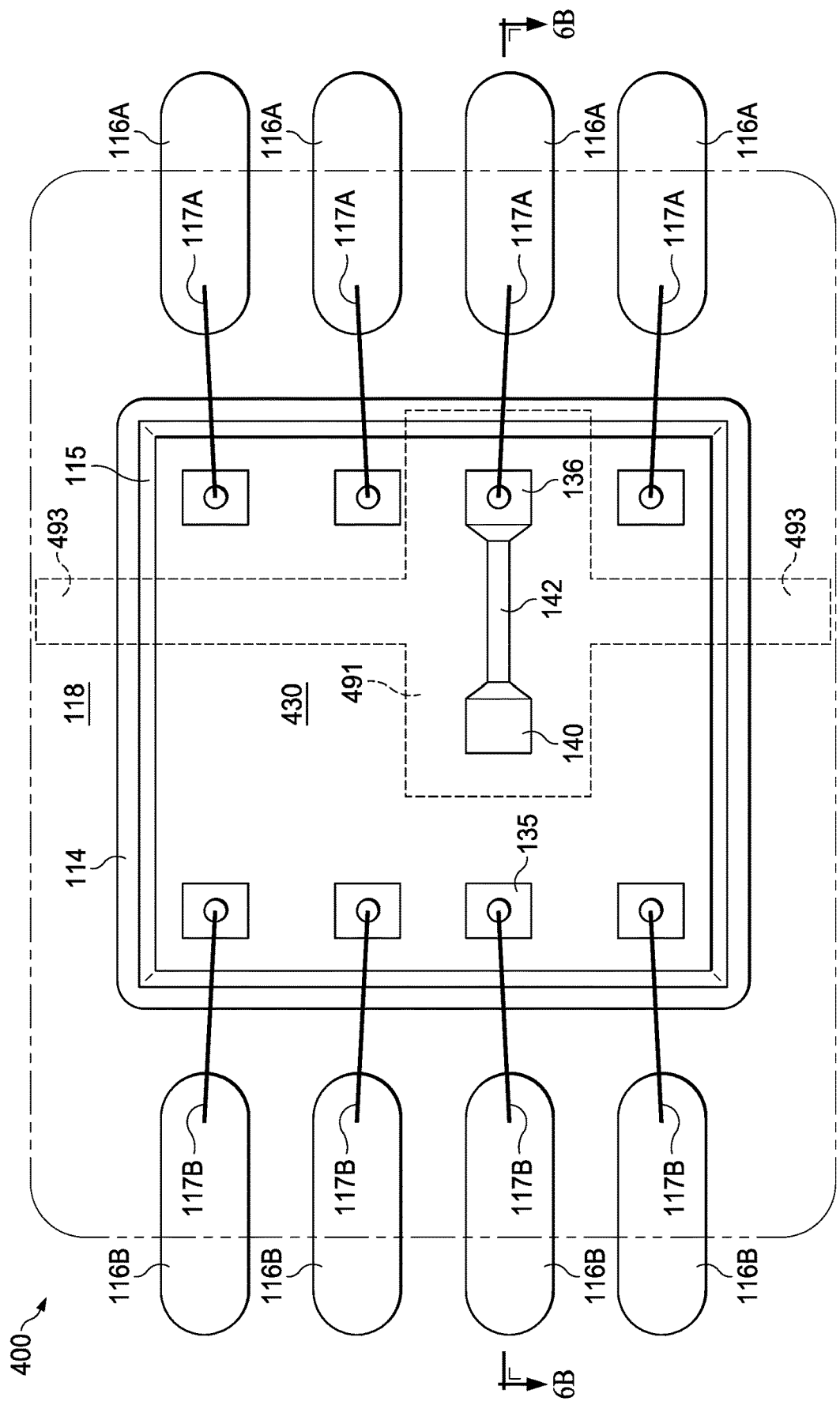
FIGS. 6A and 6B illustrate a top view and a cross-sectional view, respectively, of a semiconductor package including a semiconductor die with a sacrificial fuse element developed above a semiconductor substrate, and a plate over a profile of the sacrificial fuse element.
Figure 6B:
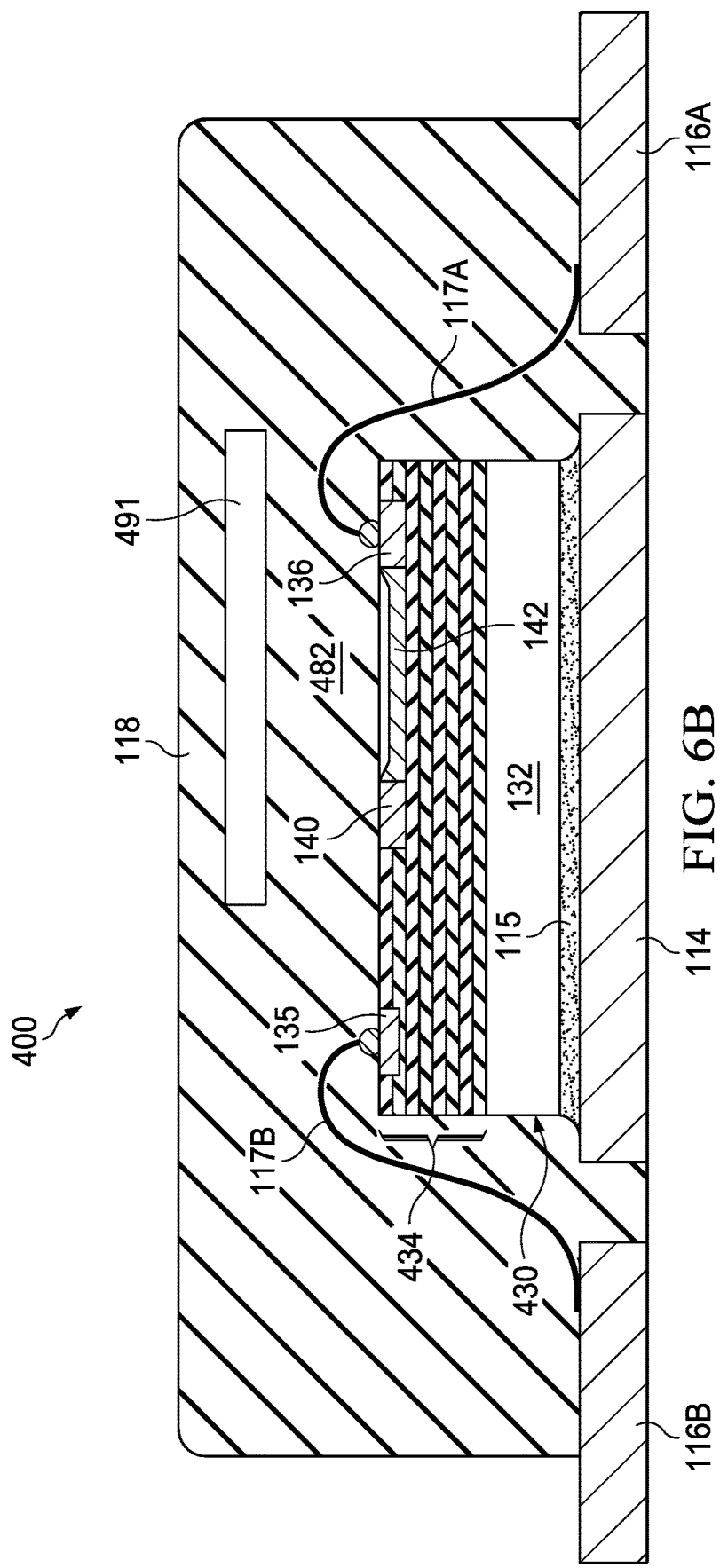

FIGS. 6A and 6B illustrate semiconductor package 400. Specifically, FIG. 6A illustrates a top view of semiconductor package 400, and FIG. 6B illustrates a cross-sectional view of semiconductor package 400. Semiconductor package 400 is substantially similar to semiconductor package 100 except for the addition of a plate 491 over a profile of sacrificial fuse element 142 and semiconductor die 430 does include not gaps within its multilayer dielectric.

Other details of semiconductor package 400 are the same as described with respect to semiconductor package 100. For example, elements of semiconductor package 400 with the same numbers as semiconductor package 100 are the same or substantially similar to those elements in semiconductor package 100. For brevity, such details and elements are described in limited or no detail with respect to semiconductor package 400.

Like semiconductor package 100, semiconductor package 400 includes a metallic pad 114 and leads 116, with a semiconductor die 430 mounted to metallic pad 114 with die attach 115. Wire bonds 117 provide electrical connections between leads 116 and bond pads on the active surface of semiconductor die 430.

Semiconductor die 430 includes two layers: semiconductor substrate 132, which is attached to metallic pad 114, and multilayer dielectric 434, which is over semiconductor substrate 132 on the active surface of semiconductor die 430. The inactive surface of semiconductor die 430, the bottom of semiconductor substrate 132, is bonded to metallic pad 114. Multilayer dielectric 434 is formed as a series of build-up layers on top of semiconductor substrate 132 and includes metallization layers providing the functional circuitry (not show) of semiconductor die 430, as described with respect to semiconductor die 130.

As also described with respect to semiconductor die 130, the metallization layers within multilayer dielectric 434 form conductive trace 140 including sacrificial fuse element 142. Package 400 includes structural features to absorb and deflect energy during a fusing event. In particular, plate 491, containing a shock-absorbing material, is located over a profile of sacrificial fuse element 142, is configured to mitigate damage outside package 400 from a fusing event. Plate 491 is a contiguous element substantially covering the profile of sacrificial fuse element 142 but separated from sacrificial fuse element 142 by a gap 482 containing mold compound 118. In some examples, plate 491 may be electrically isolated from active electronics of package 400, including semiconductor die 430. In other examples, plate 491 may be connected to ground, e.g., by way of a connection to metallic pad 114.

A melting point of the plate 491 is lower than a melting point of conductive trace 140. For example, plate 491 may include one or more of gold, iron, silver, copper, aluminum, lithium, tin, and indium. In some examples, plate 491 may contain at least 50 percent by weight aluminum, such as at least 90 percent by weight aluminum, whereas conductive trace 140 may include at least 90 percent by weight copper.

Because sacrificial fuse element 142 is located between plate 491 and metallic pad 114 along the thickness of package 400 mechanical energy released during the fusing event is somewhat confined to the area between plate 491 and metallic pad 114. By deforming and/or melting in conjunction with a fusing event, plate 491 both absorbs energy and distributes mechanical energy to mold compound 118, mitigating a risk of fragmenting mold compound 118 during a fusing event. In other examples, rather than a shock-absorbing material, plate 491 may be formed from a ceramic material configured to distribute and deflect energy within the package, thereby mitigating a risk of fragmenting mold compound 118 during a fusing event.

Semiconductor package 400 further includes tie bars 493 extending from plate 491. Tie bars 493 may be a unitary component with the same composition as plate 491. During manufacturing of package 400, plate 491 and tie bars 493 may be part of a clip array installed over a leadframe including a plurality of semiconductor dies prior to molding. In such examples, singulation of package 400 includes cutting through tie bars 493, leaving plate 491 covered mold compound 118.

Figure 7A:
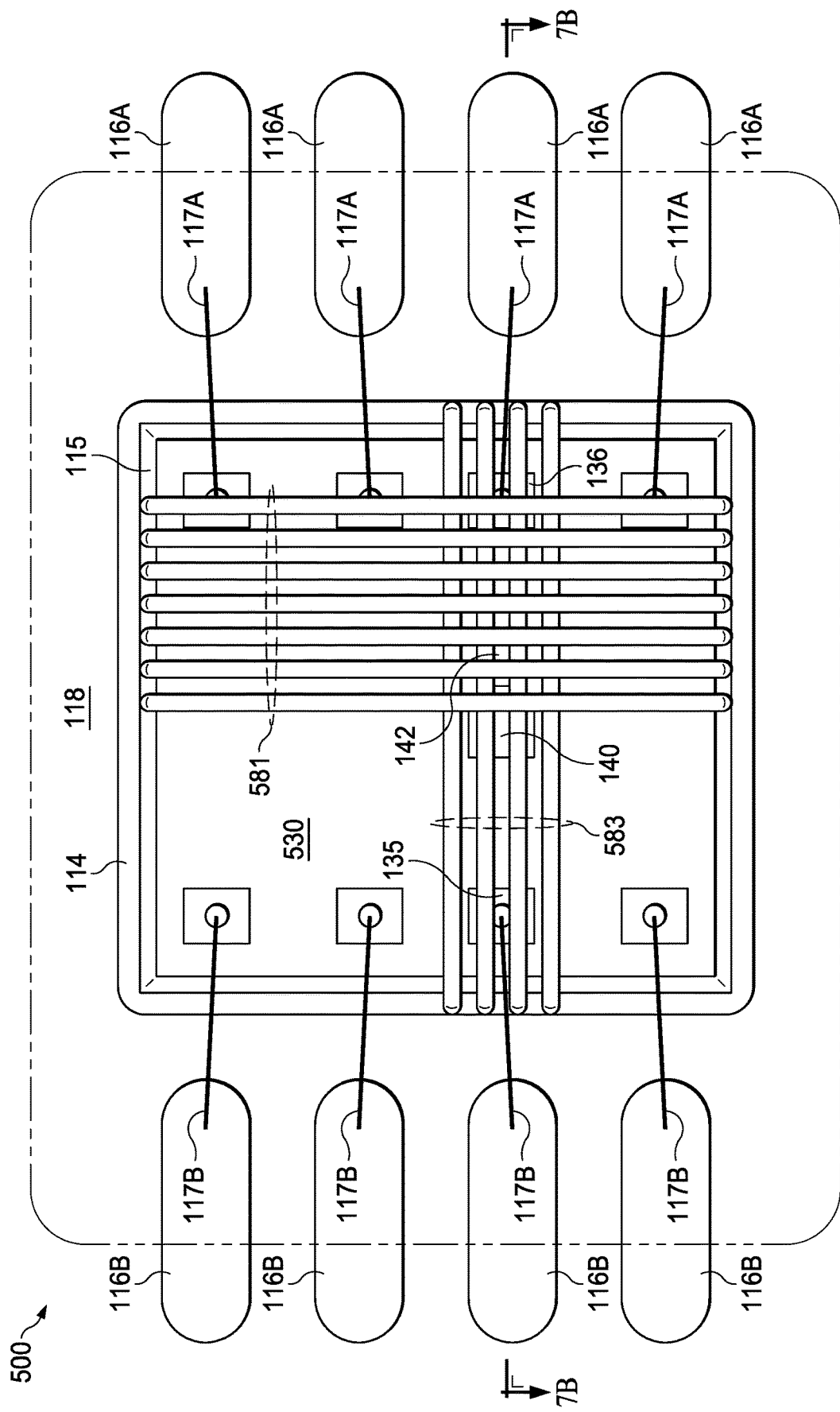
FIGS. 7A and 7B illustrate a top view and a cross-sectional view, respectively, of a semiconductor package including a semiconductor die with a sacrificial fuse element developed above a semiconductor substrate, and a plurality of wires over the profile of the sacrificial fuse element.
Figure 7B:
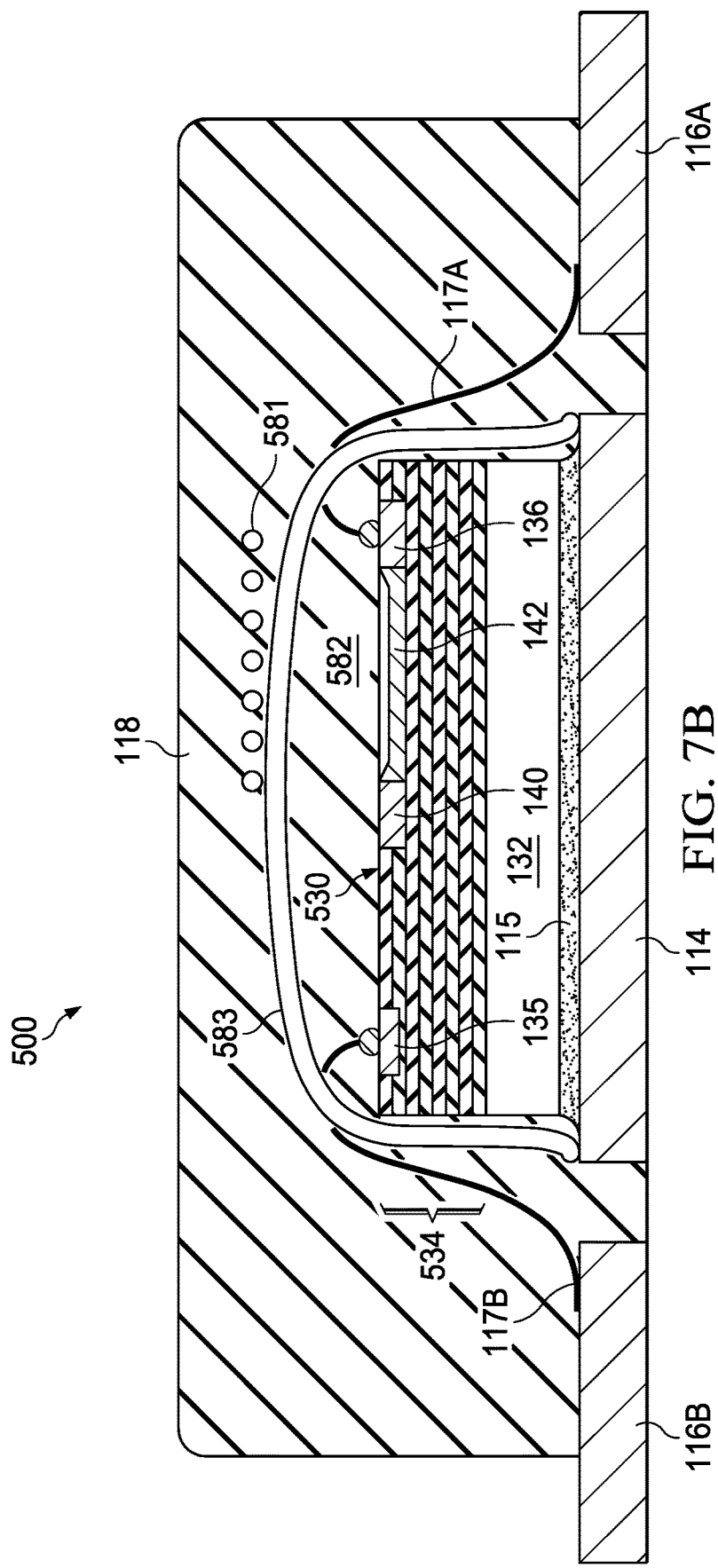

FIGS. 7A and 7B illustrate semiconductor package 500. Specifically, FIG. 7A illustrates a top view of semiconductor package 500, and FIG. 7B illustrates a cross-sectional view of semiconductor package 500. Semiconductor package 500 is substantially similar to semiconductor package 100 except for the addition of wires 581, 583 over a profile of sacrificial fuse element 142 and semiconductor die 530 does include not gaps within its multilayer dielectric. Other details of semiconductor package 500 are the same as described with respect to semiconductor package 100. For example, elements of semiconductor package 500 with the same numbers as semiconductor package 100 are the same or substantially similar to those elements in semiconductor package 100. For brevity, such details and elements are described in limited or no detail with respect to semiconductor package 500.

Like semiconductor package 100, semiconductor package 500 includes a metallic pad 114 and leads 116, with a semiconductor die 530 mounted to metallic pad 114 with die attach 115. Wire bonds 117 provide electrical connections between leads 116 and bond pads on the active surface of semiconductor die 530.

Semiconductor die 530 includes two layers: semiconductor substrate 132, which is attached to metallic pad 114, and multilayer dielectric 534, which is over semiconductor substrate 132 on the active surface of semiconductor die 530. The inactive surface of semiconductor die 530, the bottom of semiconductor substrate 132, is bonded to metallic pad 114. Multilayer dielectric 534 is formed as a series of build-up layers on top of semiconductor substrate 132 and includes metallization layers providing the functional circuitry (not show) of semiconductor die 530 as described with respect to semiconductor die 130.

As also described with respect to semiconductor die 130, the metallization layers within multilayer dielectric 534 form conductive trace 140 including sacrificial fuse element 142. Package 500 includes structural features to absorb and deflect energy during a fusing event. In particular, wires 581, 583, representing a shock-absorbing material. Wires 581 intersect wires 583 over a profile of sacrificial fuse element 142. This arrangement is configured to mitigate damage outside package 500 from a fusing event. Wires 581, 583 are separated from sacrificial fuse element 142 by a gap 582 containing mold compound 118. In the illustrated example, wires 581, 583 are connected to ground by way of the contact with metallic pad 114. In some examples, wires 581, 583 may be electrically isolated from active electronics of package 500, including semiconductor die 530.

A melting point of wires 581, 583 is lower than a melting point of conductive trace 140. For example, wires 581, 583 may include one or more of gold, iron, silver, copper, aluminum, lithium, tin, and indium. In some examples, wires 581, 583 may contain at least 50 percent by weight aluminum, such as at least 90 percent by weight aluminum, whereas conductive trace 140 may include at least 90 percent by weight copper.

Because sacrificial fuse element 142 is located between wires 581, 583 and metallic pad 114 along the thickness of package 500 mechanical energy released during the fusing event is somewhat confined to the area between wires 581, 583 and metallic pad 114. By deforming and/or melting in conjunction with a fusing event, wires 581, 583 both absorb energy and distributes mechanical energy to mold compound 118, mitigating a risk of fragmenting mold compound 118 during a fusing event.

During manufacturing of package 500, wires 581, 583 may be added by conventional wire bonding operations prior to molding mold compound 118. For example, each of wires 581, 583 may be attached on both sides to metallic pad 114 and routed to extend over semiconductor die 530.

Packages 300, 400, 500 represent example configurations of shock-absorbing material adjacent to a sacrificial fuse element, and other configurations also be suitable to deflect and absorb energy during a fusing event in accordance with the techniques disclosed herein.

Figure 8:
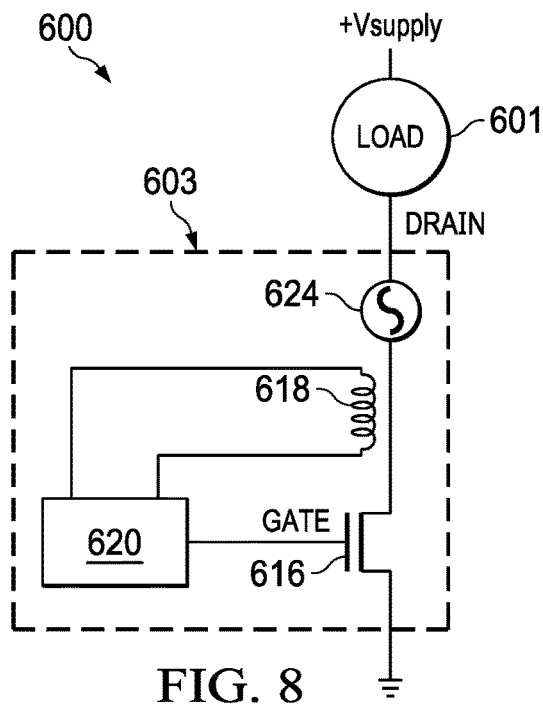
FIG. 8 illustrates a circuit including an eFuse within the same package as a fuse element.

FIG. 8 illustrates circuit 600, which includes an eFuse within the same package 603 as a fuse element 624. In various examples, circuit 600 may be incorporated into any of packages 100, 200, 300, 400, 500.

Package 603 includes an integrated circuit including current sensor 618, low side driver FET 616, and controller 620. Controller 620 is configured to issue control voltages to low side driver FET 603. Current sensor 618 is operable to measure current within conductive trace 140 and send a signal indicative of the measured current to controller 620. The integrated circuit optionally includes fuse element 624, or fuse element 624 may be a separate component within the package.

As shown in FIG. 8, circuit 600 includes load 601, which is coupled to a power supply labeled +V supply. Integrated circuit package 603 couples the ground terminal to the load 601. In the example of circuit 600, the drain terminal DRAIN for low side driver FET 616 is coupled to the load 601. Load 601 is responsive to a control voltage on the gate terminal GATE for low side driver FET 603. In some examples, the load can include resistive and inductive circuit elements coupled to package 603.

Low side driver FET 603 is connected in series between the drain terminal and ground, having a current conduction path between the drain terminal for coupling the load in series with fuse element 624 and the drain of low side driver FET 616 the current conduction path including the source of low side driver FET 616 and the series path extending to the ground terminal. In a particular example, the low side driver FET 616 can be a high voltage, low on-resistance FET such as a NexFET™ device supplied by Texas Instruments Incorporated, the owner of the present application. Other FET devices appropriate for a particular application can also be used with the embodiments.

In some examples, package 603 may be configured as an eFuse including low side driver FET 603, current sensor 618 and controller 620. An eFuse is an active circuit protection device configured to protect electrical components against hazardous current or voltage such as short circuit, inrush, overvoltage, or reverse polarity events. In such examples, the eFuse may include current sensor 618, operable to detect an over current condition within a load current conductor, such as conductive trace 140, an electronic switch operable to disrupt the load current path, such as FET 616, and a controller operable to activate the electronic switch in response to detection of current parameters outside a preset range, such as controller 620.

A fuse element 624 is shown within the package of low side driver FET 603. In some examples, fuse element 624 may represent sacrificial fuse element 142 in any of packages 100, 200, 300, 400, 500.

In FIG. 8 the FET is in a "source down" or "low-side" configuration with load coupled to the positive power supply and low side driver FET 603 coupled between the load and the ground terminal. In an alternative arrangement, the FET can be coupled in a "high side" configuration with the load coupled to a ground terminal, and the FET between the positive supply and the load. In either example, fuse element 624 is in series with the current conduction path of the FET. In an overcurrent situation, fuse element 624 opens, creating an open circuit and protecting the load from damage.

Figure 9:
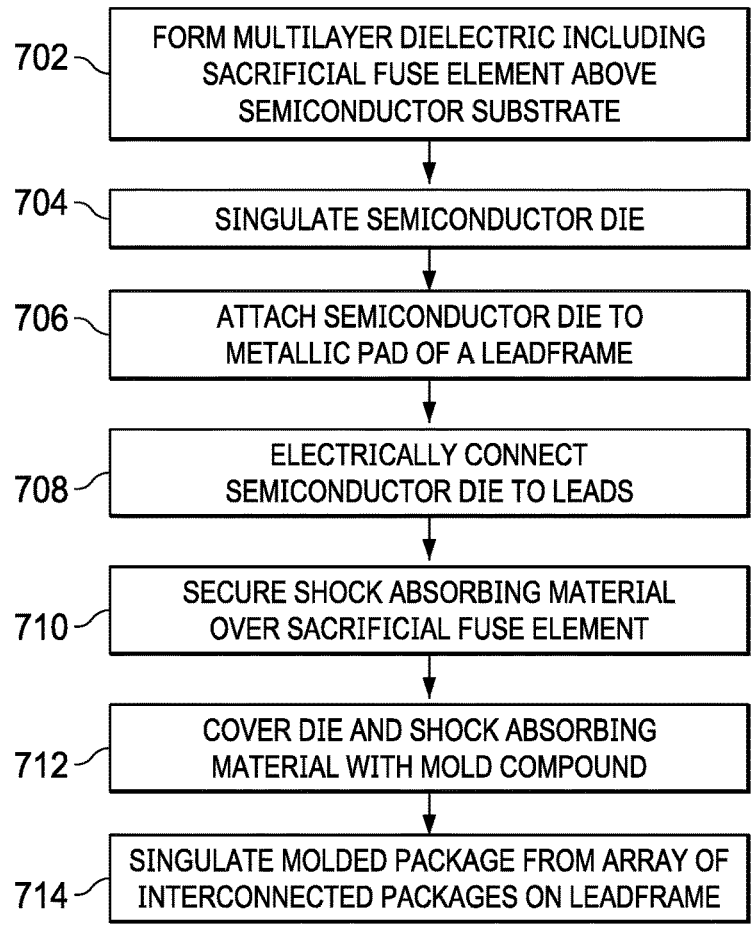
FIG. 9 is flowchart of a method of manufacturing a package with a sacrificial fuse element.

FIG. 9 is flowchart of a method of manufacturing a package with a sacrificial fuse element. For clarity, the techniques of FIG. 9 are described with respect to packages 100, 200, 300, 400, 500; however, the described techniques may also be readily adapted to alternative package configurations.

The semiconductor die, such as any of semiconductor dies 130, 160, 170, 230, 330, 430, 530, is formed on a semiconductor wafer including an array of semiconductor dies. Forming the semiconductor die includes forming a multilayer dielectric including metallization layers with functional circuitry and a sacrificial fuse element above a semiconductor substrate (FIG. 9, step 702). In some examples, forming the semiconductor die further includes forming one or more planar gaps or vias beneath a profile of the sacrificial fuse element. After the build-up of the multilayer dielectric including metallization layers with functional circuitry and the sacrificial fuse element for a plurality of dies, the semiconductor wafer is cut to singulate the semiconductor dies from the wafer (FIG. 9, step 704).

The semiconductor die is attached to a metallic pad of a leadframe by securing an inactive side of the semiconductor die to the metallic pad with die attach paste (FIG. 9, step 706). The semiconductor die, including the sacrificial fuse element is electrically coupled to one or more leads of the leadframe (FIG. 9, step 708).

Next, for the example of packages 300, 400, 500, shock-absorbing material is secured over a profile of the sacrificial fuse element (FIG. 9, step 710). For package 300, shock-absorbing material 381 is placed in direct contact with semiconductor die 330 adjacent to sacrificial fuse element 142. For package 400, plate 491 is secured with gap 482 separating plate 491 from sacrificial fuse element 142. Plate 491 may be part of a clip array installed over a leadframe including a plurality of semiconductor dies. For package 500, wires 581, 583 are wire bonded in an intersecting pattern over the profile of sacrificial fuse element 142 with gap 582 separating wires 581, 583 from sacrificial fuse element 142. Wires 581, 583 may be applied with wire bonding to metallic pad 114 on either side of semiconductor die 530.

Next, the partially assembled device is molded, thereby covering the semiconductor die, the conductor, and the shock-absorbing material, and partially covering the metallic pad and lead with a mold compound 118, with the metallic pad and the leads remaining exposed on an outer surface of the semiconductor package (FIG. 9, step 712). Finally, the array of packages on a common leadframe are singulated with a cutting operation to separate each package from the leadframe (FIG. 9, step 714).

Any of the techniques mitigate damage to other components from a fusing event as described with respect to packages 100, 200, 300, 400, 500 may be combined within a single package. For example, a package may include any combination of planar gaps or vias beneath a profile of the sacrificial fuse element, and/or well as any combination of shock-absorbing material over a profile of the sacrificial fuse element, such as an elastomeric dielectric material in direct contact with a semiconductor die as in package 300 and/or a plate spaced from the semiconductor die as in package 400 and/or a plurality of wires spaced from the semiconductor die as in package 500. Combining these techniques may offer improved energy absorption and blast control compared to any of packages 100, 200, 300, 400, 500.

The specific techniques for packages with sacrificial fuse elements configured to mitigate damage to other components from a fusing event, including techniques described with respect to packages 100, 200, 300, 400, 500, are merely illustrative of the general inventive concepts included in this disclosure as defined by the following claims.

What is claimed is:

1. A semiconductor package, comprising:
   a metallic pad and leads;
   a semiconductor die including a semiconductor substrate attached to the metallic pad, and a conductor including a sacrificial fuse element on the semiconductor substrate, the sacrificial fuse element being electrically coupled between one of the leads and at least one terminal of the semiconductor die;
   two sets of wires approximately orthogonal to each other over a profile of the sacrificial fuse element; and
   a mold compound covering the semiconductor die, the conductor, and partially covering the metallic pad and leads, with the metallic pad and the leads exposed on an outer surface of the semiconductor package.

2. The semiconductor package of claim 1, wherein the two sets of wires is separated from the sacrificial fuse element by a gap containing the mold compound.

3. The semiconductor package of claim 1, wherein a material of the two sets of wires is at least 50 percent by weight aluminum.

4. The semiconductor package of claim 1, wherein a melting point of the two sets of wires is lower than a melting point of the conductor.

5. The semiconductor package of claim 1, wherein the mold compound includes one or more of a group consisting of:
   an epoxy novolac resin;
   multi-aromatic resin; and
   multi-functional resins.

6. The semiconductor package of claim 1, wherein the sacrificial fuse element is configured to form an open circuit in an overcurrent condition.

7. The semiconductor package of claim 1, wherein the conductor is a metal conductor, wherein the sacrificial fuse element is a portion of the metal conductor with a narrowed cross section.

8. The semiconductor package of claim 7, wherein the conductor is multiple metallization layers.

9. The semiconductor package of claim 1, wherein the conductor is directly coupled to the at least one terminal of the semiconductor die.

10. The semiconductor package of claim 1, further comprising a wire bond between the one of the leads and the conductor.

11. The semiconductor package of claim 1, wherein the leads include a first terminal and a second terminal, with a load current path through the semiconductor package being between the first terminal and the second terminal, the load current path including, in series, the conductor and the semiconductor die.

12. The semiconductor package of claim 1, wherein the semiconductor die forms an electronic switch operable to disrupt the load current path, and a controller operable to activate the electronic switch in response to detection of current parameters outside a preset range.

13. The semiconductor package of claim 1, further comprising a current sensor, the current sensor being operable to measure current within the conductor and send a signal indicative of the measured current to the controller.

14. The semiconductor package of claim 1, wherein the semiconductor substrate is formed from a polysilicon.

15. The semiconductor package of claim 1, further comprising a multilayer dielectric between the sacrificial fuse element and the semiconductor substrate.

16. The semiconductor package of claim 15, wherein the multilayer dielectric is selected from a group consisting of:
   silicate glass; and
   silicon oxycarbide.

17. The semiconductor package of claim 1, wherein the two sets of wires include one or more of gold, iron, silver, copper, aluminum, lithium, tin, and indium.

18. The semiconductor package of claim 1, wherein the two sets of wires are electrically isolated from active electronics of semiconductor package.

19. The semiconductor package of claim 1, wherein the two sets of wires are electrically connected to a ground voltage.

* * * * *